United States Patent
Liu et al.

(10) Patent No.: US 11,243,717 B2
(45) Date of Patent: Feb. 8, 2022

(54) METHOD, ELECTRONIC DEVICE AND COMPUTER PROGRAM PRODUCT FOR PROCESSING DATA

(71) Applicant: EMC IP Holding Company LLC, Hopkinton, MA (US)

(72) Inventors: Bing Liu, Tianjin (CN); Tao Chen, Beijing (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 16/864,097

(22) Filed: Apr. 30, 2020

(65) Prior Publication Data

US 2021/0132861 A1    May 6, 2021

(30) Foreign Application Priority Data

Oct. 31, 2019    (CN) .......................... 201911051451.7

(51) Int. Cl.
*G06F 3/06* (2006.01)
*H03M 7/30* (2006.01)

(52) U.S. Cl.
CPC ............ *G06F 3/0659* (2013.01); *G06F 3/064* (2013.01); *G06F 3/0608* (2013.01); *G06F 3/0611* (2013.01); *G06F 3/0653* (2013.01); *G06F 3/0685* (2013.01); *H03M 7/30* (2013.01)

(58) Field of Classification Search
CPC ...... G06F 3/0653; G06F 3/0659; G06F 3/064; G06F 3/0685; G06F 3/0611; G06F 3/0608; H03M 7/30; H03M 7/6029
USPC ........................................................ 711/117
See application file for complete search history.

(56) References Cited

U.S. PATENT DOCUMENTS

| | | | |
|---|---|---|---|
| 2007/0109155 A1* | 5/2007 | Fallon ................. | H03M 7/4006 341/50 |
| 2017/0090775 A1* | 3/2017 | Kowles ................ | G06F 3/0685 |
| 2017/0277597 A1* | 9/2017 | Dillon ................. | G06F 11/1453 |

OTHER PUBLICATIONS

Will, B et al., "Intel® QuickAssist Technology & OpenSSL—1.1.0: Performance" Network Security Content Delivery Networks, Web Servers, Load Balancing, Intel, 2017 (12 pages).

* cited by examiner

*Primary Examiner* — David Yi
*Assistant Examiner* — Zubair Ahmed
(74) *Attorney, Agent, or Firm* — Chamberlain, Hrdlicka, White, Williams & Aughtry

(57) ABSTRACT

Embodiments of the present disclosure relate to a method, electronic device and computer program product for processing data. The method comprises determining a first hotness associated with a first compressed data block stored on a first storage device. The method also comprises: determining, based on the hotness, whether the first compressed data is stored to the second storage device, a type of the second storage device being different from a type of the first storage device. The method further comprises: in response to determining that the first compressed data block is stored to the second storage device, generating, based on a second compression level of the compression algorithm, a second compressed data block from the first compressed data block for storing to the second storage device, wherein the second compression level corresponds to the second storage device.

15 Claims, 4 Drawing Sheets

US 11,243,717 B2

METHOD, ELECTRONIC DEVICE AND COMPUTER PROGRAM PRODUCT FOR PROCESSING DATA

CROSS-REFERENCE TO RELATED APPLICATIONS

This application claims priority to Chinese Application No. 201911051451.7 filed on Oct. 31, 2019. Chinese Application No. 201911051451.7 is hereby incorporate by reference it is entirety.

FIELD

Embodiments of the present disclosure generally relate to the computer field, and more specifically, to method, electronic device and computer program product for processing data.

BACKGROUND

With the rapid development of computer technologies, the amount of computer applications has rapidly increased. Therefore, the data to be processed also has increased rapidly. Usually, the processed data or the newly generated data should be stored to facilitate re-reading and re-acquisition by users. Therefore, many storage devices are utilized for storing/backing up various data.

For the purpose of storing/backing up various data, a computing device for managing data storage usually compresses the acquired data. After being compressed, the data to be stored will occupy less storage space, so as to save the occupied storage resources. If users need to re-acquire the data, the computing device will decompress the compressed data to re-generate the data. However, there are many issues that remain unsolved in the procedure of data compression and storage.

SUMMARY

Embodiments of the present disclosure provide a method, electronic device and computer program product for processing data.

In accordance with a first aspect of the present disclosure, there is provided a method for processing data. The method comprises: determining a first hotness associated with a first compressed data block stored on a first storage device, wherein the first hotness indicates access frequency of the first compressed data block for a predetermined period of time and a first compression level of a compression algorithm for the first compressed data block corresponds to the first storage device. The method also comprises: determining, based on the hotness, whether the first compressed data block is stored to the second storage device, a type of the second storage device being different from a type of the first storage device. The method further comprises: in response to determining that the first compressed data block is stored to the second storage device, generating, based on a second compression level of the compression algorithm, a second compressed data block from the first compressed data block for storing to the second storage device, wherein the second compression level corresponds to the second storage device and a compression degree for the second compression level is higher than a compression degree for the first compression level.

In accordance with a second aspect of the present disclosure, there is provided an electronic device. The electronic device comprises a processor; and a memory storing computer program instructions, the processor running the computer program instructions in a memory to control the electronic device to perform acts comprising: determining a first hotness associated with a first compressed data block stored on a first storage device, wherein the first hotness indicates access frequency of the first compressed data block for a predetermined period of time and a first compression level of a compression algorithm for the first compressed data block corresponds to the first storage device; determining, based on the hotness, whether the first compressed data block is stored to the second storage device, a type of the second storage device being different from a type of the first storage device; and in response to determining that the first compressed data block is stored to the second storage device, generating, based on a second compression level of the compression algorithm, a second compressed data block from the first compressed data block for storing to the second storage device, wherein the second compression level corresponds to the second storage device and a compression degree for the second compression level is higher than a compression degree for the first compression level.

In accordance with a third aspect of the present disclosure, there is provided a computer program product tangibly stored on a non-volatile computer-readable medium and including machine-executable instructions, the machine-executable instructions, when executed, causing a machine to perform steps of the method according to the first aspect of the present disclosure.

BRIEF DESCRIPTION OF THE DRAWINGS

Through the following more detailed description of the example embodiments of the present disclosure with reference to the accompanying drawings, the above and other objectives, features, and advantages of the present disclosure will become more apparent, wherein the same reference sign usually refers to the same component in the example embodiments of the present disclosure.

In each drawing, same or corresponding reference signs indicate same or corresponding parts.

DETAILED DESCRIPTION OF EMBODIMENTS

Figure 1:
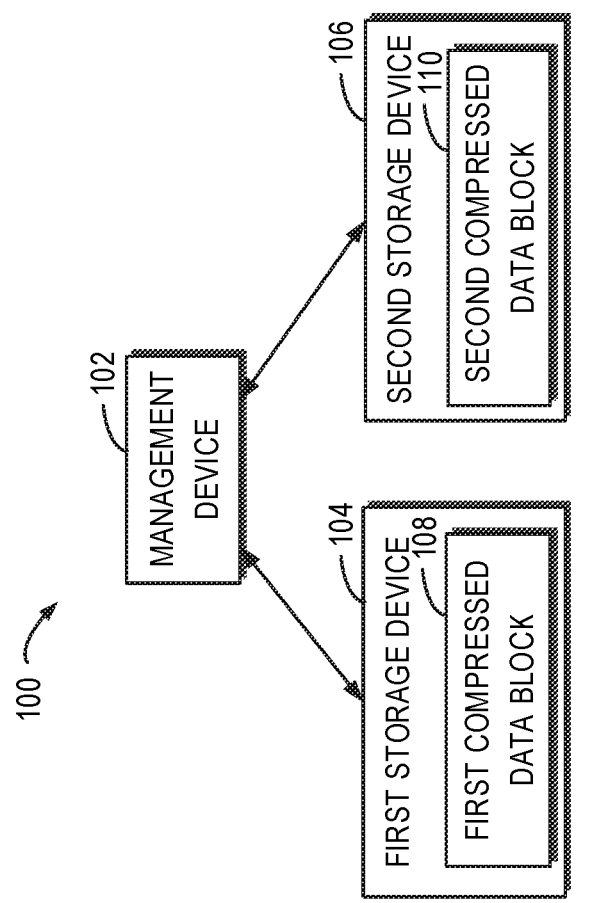
FIG. 1 illustrates a schematic diagram of an example environment 100 where device and/or method in accordance with embodiments of the present disclosure can be implemented.

The embodiments of the present disclosure will be described in more detail with reference to the drawings. Although the drawings illustrate some embodiments of the present disclosure, it should be appreciated that the present disclosure can be implemented in various manners and should not be limited to the embodiments explained herein. On the contrary, the embodiments are provided to understand the present disclosure in a more thorough and complete way. It should be appreciated that drawings and embodiments of the present disclosure are only for exemplary purposes rather than restricting the protection scope of the present disclosure.

In the descriptions of the embodiments of the present disclosure, the term "includes" and its variants are to be read as open-ended terms that mean "includes, but is not limited to." The term "based on" is to be read as "based at least in part on." The terms "one embodiment" and "this embodiment" are to be read as "at least one embodiment." The terms "first", "second" and so on can refer to same or different objects. The following text also can comprise other explicit and implicit definitions.

The principle of the present disclosure will be described with reference to the several example embodiments shown in the drawings. Although the drawings illustrate preferred embodiments of the present disclosure, it should be understood that the embodiments are described merely to enable those skilled in the art to better understand and further implement the present disclosure and is not intended for limiting the scope of the present disclosure in any manner.

Flash drives or solid-state disks have been used for data backup or data storage. They may serve as metadata cache tier or data cache tier. Although flash drives or solid-state disks can provide satisfactory performance and fast storage speed, they cost too much, therefore, are not suitable for storing large amounts of data. However, Hard Disk Drive (HDD) with a less satisfactory performance is suitable for storage of large amounts data. If data are stored directly to different types of storage devices, storage resources may be wasted.

To at least solve the above problem, the present disclosure provides a method for processing data. In the method, a first hotness associated with a first compressed data block stored on a first storage device is determined first. Then, it is determined, based on the hotness, whether the first compressed data is stored to the second storage device, a type of the second storage device being different from a type of the first storage device. When it is determined that the first compressed data block is stored to the second storage device, a second compressed data block is generated from the first compressed data block for storing to the second storage device based on a second compression level of the compression algorithm. The above method may make better use of the storage space of the high-performance storage device, to enable the high-performance storage device to store more data, which enhances data processing efficiency and improves utilization rate of the storage device.

FIG. 1 below illustrates a schematic diagram of an example environment 100 where device and/or method in accordance with embodiments of the present disclosure can be implemented.

As shown in FIG. 1, the example environment 100 includes a management device 102, a first storage device 104 and a second storage device 106. The management device 102 manages data stored in the first storage device 104 and the second storage device 106, such as reading and writing data. The management device 102 also compresses and decompresses the data within the first storage device 104 and the second storage device 106.

The first storage device 104 is provided for storing a large amount of data. However, the performance of the first storage device 104 is low. Therefore, the first storage device 104 accesses the data at a low rate. In some embodiments, the first storage device 104 may be a hard disk drive. The above example is used merely for describing the present disclosure, rather than restricting it.

The second storage device 106, which is used for storing data, is of a different type than the first storage device 104. Due to its high performance, the second storage device 106 accesses the data at a high rate. In some embodiments, the second storage device 106 may be a solid-state disk or flash device. The above example is used merely for describing the present disclosure, rather than restricting it.

The management device 102 compresses the data stored in the first storage device 104 and the second storage device 106. A compression level of the data compression algorithm adopted by the management device 102 is related to the type of the storage device. In some embodiments, a first type for the first storage device 104 corresponds to a first compression level of the compression algorithm and a second type for the second storage device 106 corresponds to a second compression level of the compression algorithm. A compression degree of the first compression level is lower than that of the second compression level. In some embodiments, when the compression algorithm includes a plurality of compression levels, the first compression level is the lowest level in the compression algorithm and the second compression level is the second lowest level in the compression algorithm. In some embodiments, the first compression level and the second compression level are two compression levels in a plurality of compression levels of the compression algorithm, wherein the compression degree of the second compression level is higher than that of the first compression level. The above examples are used merely for describing the present disclosure, rather than restricting it.

A first compressed data block 108 is stored in the first storage device 104. The first compressed data block 108 is generated using the first compression level of the compression algorithm. There is a hotness for the first compressed data block 108. The hotness indicates access frequency of the first compressed data block 108 for a predetermined period of time. If the hotness of the first compressed data block 108 exceeds a threshold hotness, the first compressed data block 108 is stored to the second storage device 106. In some embodiments, the first compressed data block 108 has the highest hotness.

When the first compressed data block 108 is stored to the second storage device 106, the management device 102 decompresses the first compressed data block 108. Then, the management device 102 compresses the decompressed first compressed data block 108 using the second compression level corresponding to the second storage device 106 to generate a second compressed data block 110. The second compressed data block 110 is then stored to the second storage device 106. In some embodiments, the second compression level of the compression algorithm is determined based on a device type of the second storage device 106.

Upon receiving data to be stored or backed up from the users, the management device 102 generates metadata for the data. Usually, the management device 102 compresses user data and then stores to the first storage device 104. The metadata of the user data are quite important because they are used frequently. The metadata are compressed using the compression algorithm with the second compression level and stored to the second storage device.

The management device 102 may also migrate the data stored in the first storage device 104 and the second storage device 106 to a cloud storage device. When storage time of the data in the first storage device 104 or the second storage device 106 exceeds a predetermined time length, the data are migrated to the cloud storage device. In some embodiments, the data to be migrated are firstly decompressed and then re-compressed using a compression level related to the cloud storage device. For example, the decompressed data are re-compressed using an algorithm with higher or lower compression levels. Alternatively or additionally, de-duplication may be performed before the re-compression. In some embodiments, the compressed data in the first storage device 104 or the second storage device 106 are migrated directly to the cloud storage device. The above examples are used merely for describing the present disclosure, rather than restricting it.

The schematic diagram of the environment 100 where device and/or method in accordance with embodiments of the present disclosure can be implemented has been described above with reference to FIG. 1. Then, a method 200 for processing data in accordance with embodiments of the present disclosure is depicted below with reference to FIG. 2, wherein the method 200 may be executed at the management device 102 in FIG. 1 or any other suitable devices.

At box 202, the management device 102 determines a first hotness associated with the first compressed data block 108 stored on the first storage device 104. The first hotness indicates access frequency of the first compressed data block 108 for a predetermined period of time and the first compression level of the compression algorithm for the first compressed data block 108 corresponds to the first storage device 104.

When the first compressed data block 108 stored on the first storage device 104 is frequently accessed within the predetermined period of time, the hotness increases. In some embodiments, every time the first compressed data block 108 is accessed, the hotness is added by 1. The above examples are used merely for describing the present disclosure, rather than restricting it.

At box 204, the management device 102 determines, based on the hotness, whether the first compressed data block 108 is stored to the second storage device 106 or not, wherein the type of the second storage device 106 is different from that of the first storage device 104.

In some embodiments, the management device 102 compares the first hotness with a first threshold hotness. If the first hotness is larger than the first threshold hotness, the management device 102 determines that the first compressed data block 108 is stored to the second storage device 106. If the first hotness is less than or equal to the first threshold hotness, the management device 102 will not move the first compressed data block 108.

At box 206, the management device 102 generates, based on the second compression level of the compression algorithm, the second compressed data block 110 from the first compressed data block 108 for storing to the second storage device. The second compression level corresponds to the second storage device and the compression degree for the second compression level is higher than that for the first compression level.

In some embodiments, when it is determined that the first compressed data block 108 is stored to the second storage device 106, the management device 102 firstly decompresses the first compressed data block 108. Then, the management device 102 compresses the decompressed first compressed data block 108 using the compression algorithm with the second compression level to generate the second compressed data block 110.

In some embodiments, when the second compressed data block 110 is stored to the second storage device 106, the management device 102 may obtain a second hotness associated with the second compressed data block 110. The management device 120 compares the second hotness with a threshold second hotness. When the second hotness is less than the second threshold hotness, the management device 102 stores the second compressed data block 110 to the first storage device 104. When the second hotness is not less than the second threshold hotness, the second compressed data block 110 is not moved.

In some embodiments, when the second compressed data block 110 is moved to the first storage device 104, the second compressed data block 110 is decompressed. The decompressed second compressed data block 110 is then stored to the first storage device 104. Alternatively or additionally, de-duplication is performed before re-compression. In some embodiments, the second compressed data block 110 is directly stored to the first storage device 104.

In some embodiments, the second threshold hotness is identical to the first threshold hotness. In some embodiments, the second threshold hotness is different from the first threshold hotness. The above examples are used merely for describing the present disclosure, rather than restricting it. Those skilled in the art may set the first hotness threshold and the second hotness threshold to any suitable values according to the requirements.

In some embodiments, the management device 102 determines, according to a first time length for which the first compressed data block 108 is stored in the first storage device and a second time length for which the second compressed data block 110 is stored in the second storage device, that the first compressed data block 108 or the second compressed data block 110 is migrated to the cloud storage device. In some embodiments, if a sum of the first time length and the second time length exceeds a threshold time length, the management device 102 migrates the first compressed data block 108 or the second compressed data block 110 to the cloud storage device.

In some embodiments, the data to be migrated are decompressed and then re-compressed with the compression level related to the cloud storage device. For example, the decompressed data are re-compressed using the compression algorithm with higher or lower compression levels. Alternatively or additionally, de-duplication may be performed before re-compression. In some embodiments, the compressed data in the first storage device 104 or the second storage device 106 may be migrated directly to the cloud storage device. The above examples are used merely for describing the present disclosure, rather than restricting it.

The above method may make better use of the storage space of the high-performance storage device, to enable the high-performance storage device to store more data, which enhances data processing efficiency and improves utilization rate of the storage device.

Figure 2:
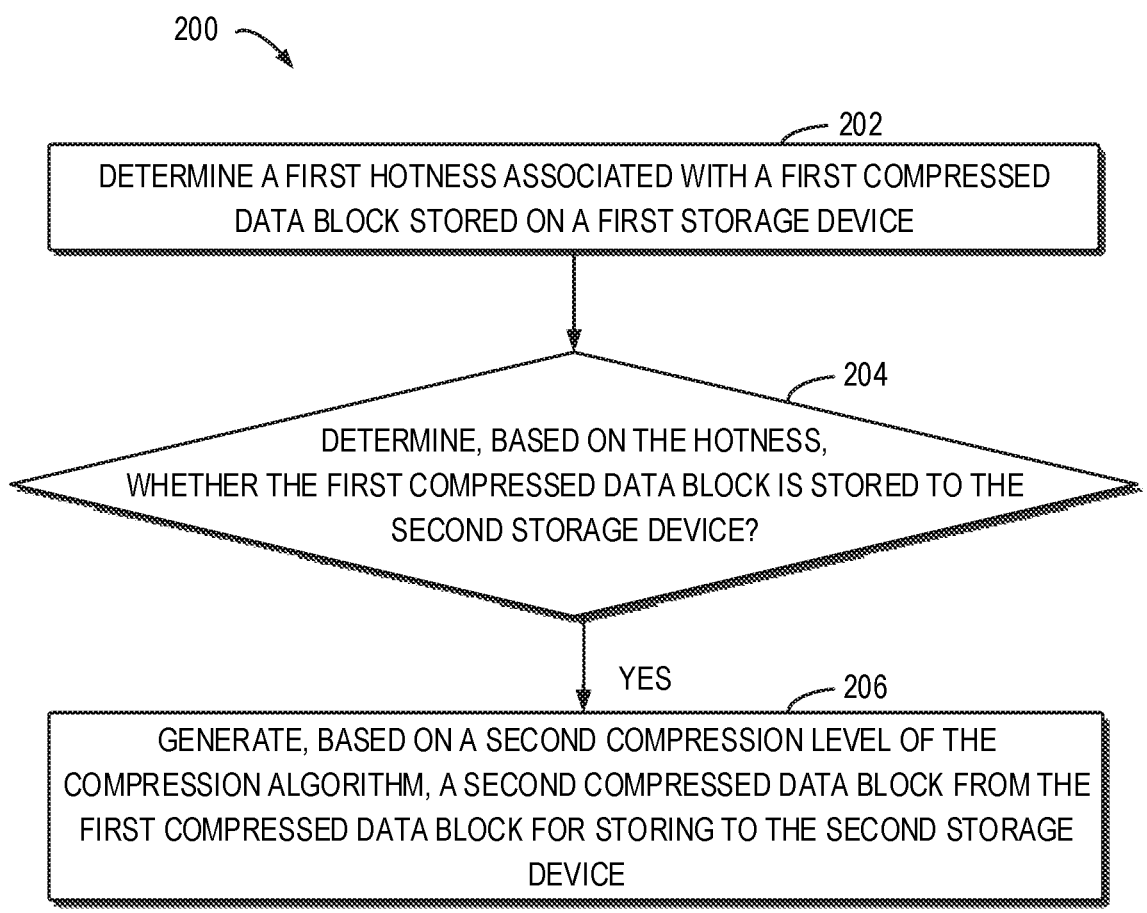
FIG. 2 illustrates a flowchart of a method 200 for processing data in accordance with embodiments of the present disclosure.
Figure 3:
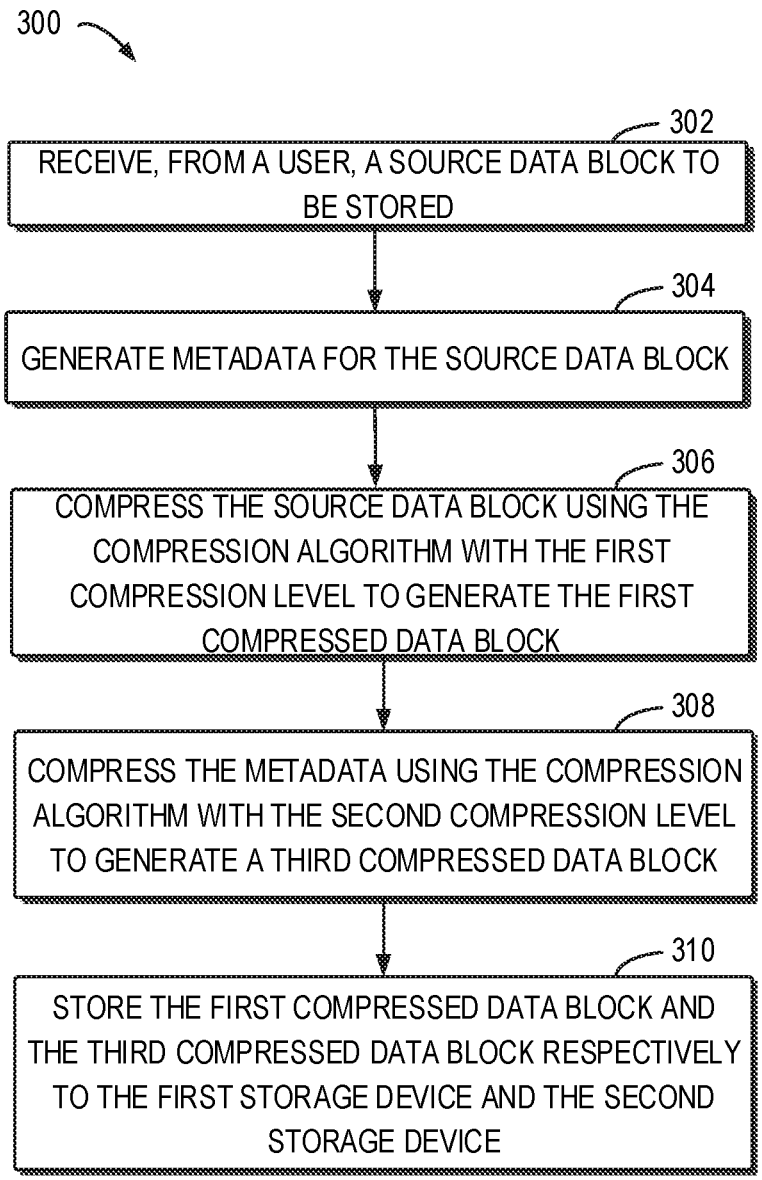
FIG. 3 illustrates a flowchart of a method 300 for processing data in accordance with embodiments of the present disclosure.

The method 200 for processing data in accordance with embodiments of the present disclosure has been depicted above with reference to FIG. 2. Then, a method 300 for processing data in accordance with embodiments of the present disclosure is described below with reference to FIG. 3, wherein the method 300 may be executed at the management device 102 in FIG. 1 or any other suitable devices.

At box 302, the management device 102 receives, from a user, a source data block to be stored. In order to store or back up the data, the users usually send the data to the management device 102, which manages storage of the source data block received from the users.

At box 304, the management device 102 generates metadata for the source data block. The management device 102 may generate metadata for the source data block received from the users. In some embodiments, the metadata describe information about the storage position of the received source data block in the storage device.

At box 306, the management device 102 compresses the source data block using the compression algorithm with the first compression level to generate the first compressed data block 108. The source data block received from the users usually is stored to the first storage device 104 with low performance. At this time, the management device 102 determines the first compression level corresponding to the first storage device 104 and then compresses the source data block using a first compression algorithm with the first compression level to generate the first compressed data block 108.

At box 308, the management device 102 compresses the metadata using the compression algorithm with the second compression level to generate a third compressed data block. Because the metadata is often used for accessing the first compressed data block 108, the metadata is stored in the second storage device 106 with high performance. At this point, the second compression level of the compression algorithm corresponding to the type of the second storage device 106 is determined. Afterwards, the metadata are compressed using the compression algorithm with the second compression level to generate the third compressed data block.

At box 310, the management device 102 stores the first compressed data block 108 and the third compressed data block, respectively, to the first storage device 104 and the second storage device 106.

A high-level compression is performed on the metadata through the above method to store the metadata on the high-performance device. As a result, such operation reduces the space occupied by the metadata, enhances the processing efficiency of the metadata and increases the utilization rate of the high-performance storage device.

Figure 4:
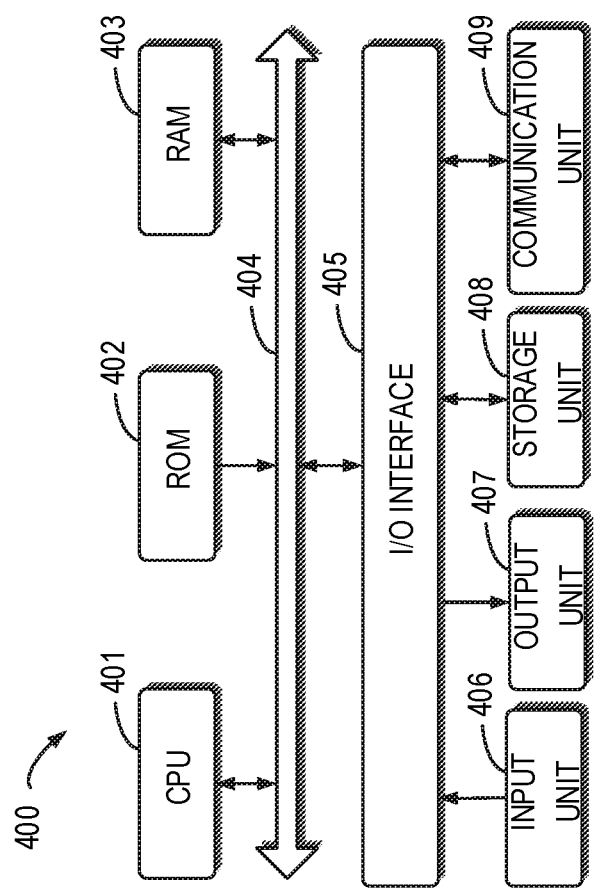
FIG. 4 illustrates a schematic block diagram of an example device 400 for implementing embodiments of the present disclosure.

FIG. 4 illustrates a schematic block diagram of an example device 400 for implementing embodiments of the present disclosure. For example, the management device 102 shown in FIG. 1 can be performed by the device 400. As shown, the device 400 includes a central processing unit (CPU) 401, which can execute various suitable actions and processing based on the computer program instructions stored in the read-only memory (ROM) 402 or computer program instructions loaded in the random-access memory (RAM) 403 from a storage unit 408. The RAM 403 can also store all kinds of programs and data required by the operations of the device 400. CPU 401, ROM 402 and RAM 403 are connected to each other via a bus 404. The input/output (I/O) interface 405 is also connected to the bus 404.

A plurality of components in the device 400 is connected to the I/O interface 405, including: an input unit 406, such as keyboard, mouse and the like; an output unit 407, e.g., various kinds of display and loudspeakers etc.; a storage unit 408, such as disk, optical disk etc.; and a communication unit 409, such as network card, modem, wireless transceiver and the like. The communication unit 409 allows the device 400 to exchange information/data with other devices via the computer network, such as Internet, and/or various telecommunication networks.

The above described various procedures and processing, such as methods 200 and 300, can be executed by the processing unit 401. For example, in some embodiments, methods 200 and 300 can be implemented as computer software programs tangibly included in the machine-readable medium, such as storage unit 408. In some embodiments, the computer program can be partially or fully loaded and/or mounted to the device 400 via ROM 402 and/or communication unit 409. When the computer program is loaded to RAM 403 and executed by the CPU 401, one or more actions of the above described methods 200 and 300 can be executed.

The present disclosure can be a method, apparatus, system and/or computer program product. The computer program product can include a computer-readable storage medium loaded with computer-readable program instructions for executing various aspects of the present disclosure.

The computer-readable storage medium can be a tangible apparatus that maintains and stores instructions utilized by the instruction executing apparatuses. The computer-readable storage medium can be, but not limited to, electrical storage device, magnetic storage device, optical storage device, electromagnetic storage device, semiconductor storage device or any appropriate combinations of the above. More concrete examples of the computer-readable storage medium (non-exhaustive list) include: portable computer disk, hard disk, random-access memory (RAM), read-only memory (ROM), erasable programmable read-only memory (EPROM or flash), static random-access memory (SRAM), portable compact disk read-only memory (CD-ROM), digital versatile disk (DVD), memory stick, floppy disk, mechanical coding devices, punched card stored with instructions thereon, or a projection in a slot, and any appropriate combinations of the above. The computer-readable storage medium utilized here is not interpreted as transient signals per se, such as radio waves or freely propagated electromagnetic waves, electromagnetic waves propagated via waveguide or other transmission media (such as optical pulses via fiber-optic cables), or electric signals propagated via electric wires.

The described computer-readable program instruction herein can be downloaded from the computer-readable storage medium to each computing/processing device, or to an external computer or external storage via Internet, local area network, wide area network and/or wireless network. The network can include copper-transmitted cable, optical fiber transmission, wireless transmission, router, firewall, switch, network gate computer and/or edge server. The network adapter card or network interface in each computing/processing device receives computer-readable program instructions from the network and forwards the computer-readable program instructions for storage in the computer-readable storage medium of each computing/processing device.

The computer program instructions for executing operations of the present disclosure can be assembly instructions, instructions of instruction set architecture (ISA), machine instructions, machine-related instructions, microcodes, firmware instructions, state setting data, or source codes or target codes written in any combinations of one or more programming languages, wherein the programming languages consist of object-oriented programming languages, such as Smalltalk, C++ and the like, and traditional procedural programming languages, e.g., C language or similar programming languages. The computer-readable program instructions can be implemented fully on the user computer, partially on the user computer, as an independent software package, partially on the user computer and partially on the remote computer, or completely on the remote computer or server. In the case where remote computer is involved, the remote computer can be connected to the user computer via any type of networks, including local area network (LAN) and wide area network (WAN), or to the external computer (e.g., connected via Internet using the Internet service provider). In some embodiments, state information of the computer-readable program instructions is used to customize an electronic circuit, e.g., programmable logic circuit, field programmable gate array (FPGA) or programmable logic array (PLA). The electronic circuit can execute computer-readable program instructions to implement various aspects of the present disclosure.

Each aspect of the present disclosure is disclosed here with reference to the flow chart and/or block diagram of method, apparatus (system) and computer program product according to embodiments of the present disclosure. It should be understood that each block of the flow chart and/or block diagram and combinations of each block in the flow chart and/or block diagram can be implemented by the computer-readable program instructions.

The computer-readable program instructions can be provided to the processing unit of general-purpose computer, dedicated computer or other programmable data processing apparatuses to manufacture a machine, such that the instructions that, when executed by the processing unit of the computer or other programmable data processing apparatuses, generate an apparatus for implementing functions/actions stipulated in one or more blocks in the flow chart and/or block diagram. The computer-readable program instructions can also be stored in the computer-readable storage medium and cause the computer, programmable data processing apparatus and/or other devices to work in a particular manner, such that the computer-readable medium stored with instructions contains an article of manufacture, including instructions for implementing various aspects of the functions/actions stipulated in one or more blocks of the flow chart and/or block diagram.

The computer-readable program instructions can also be loaded into computer, other programmable data processing apparatuses or other devices, so as to execute a series of operation steps on the computer, other programmable data processing apparatuses or other devices to generate a computer-implemented procedure. Therefore, the instructions executed on the computer, other programmable data processing apparatuses or other devices implement functions/actions stipulated in one or more blocks of the flow chart and/or block diagram.

The flow chart and block diagram in the drawings illustrate system architecture, functions and operations that may be implemented by device, method and computer program product according to multiple implementations of the present disclosure. In this regard, each block in the flow chart or block diagram can represent a module, a part of program segment or code, wherein the module and the part of program segment or code include one or more executable instructions for performing stipulated logic functions. In some alternative implementations, it should be noted that the functions indicated in the block can also take place in an order different from the one indicated in the drawings. For example, two successive blocks can be in fact executed in parallel or sometimes in a reverse order depending on the involved functions. It should also be noted that each block in the block diagram and/or flow chart and combinations of the blocks in the block diagram and/or flow chart can be implemented by a hardware-based system exclusive for executing stipulated functions or actions, or by a combination of dedicated hardware and computer instructions.

Various embodiments of the present disclosure have been described above and the above description is only exemplary rather than exhaustive and is not limited to the embodiments disclosed herein. Many modifications and alterations, without deviating from the scope and spirit of the explained various embodiments, are obvious for those skilled in the art. The selection of terms in the text aims to best explain principles and actual applications of each embodiment and technical improvements made to the technology in the market by each embodiment, or enable other ordinary skilled in the art to understand embodiments of the present disclosure.

We claim:

1. A method of processing data, comprising:
   identifying a first hotness associated with a first compressed data block stored on a first storage device,
      wherein the first hotness indicates access frequency of the first compressed data block for a predetermined period of time, and
      wherein a first compression level of a compression algorithm for the first compressed data block corresponds to the first storage device;
   making a first determination, based on the first hotness, that the first compressed data block is to be stored on a second storage device,
      wherein a second type of the second storage device is different than a first type of the first storage device;
   generating, based on the first determination, a second compressed data block from the first compressed data block to be stored on to the second storage device;
   making a second determination that a sum of a first time length and a second time length exceeds a time threshold,
      wherein the first time length is how long the first compressed data block has been stored on the first storage device, and
      wherein the second time length is how long the second compressed data block has been stored on the second storage device; and
   migrating, based on the second determination, one selected from the group consisting of the first compressed data block and the second compressed data block to a cloud storage device.

2. The method of claim 1, wherein the first determination comprises:
   comparing the first hotness with a first threshold hotness; and
   in response to the first hotness being larger than the first threshold hotness, determining that the first compressed data block is to be stored on the second storage device.

3. The method of claim 1, wherein generating the second compressed data block comprises:
   in response to determining that the first compressed data block is to be stored on the second storage device, decompressing the first compressed data block; and
   compressing the decompressed first compressed data block using the compression algorithm with a second compression level to generate the second compressed data block,
   wherein the second compression level corresponds to the second storage device and a compression degree for the second compression level is higher than a compression degree for the first compression level.

4. The method of claim 1, further comprising:
   determining a second hotness related to the second compressed data block;
   comparing the second hotness with a second threshold hotness; and
   in response to the second hotness being less than the second threshold hotness:
      storing the second compressed data block to the first storage device.

5. The method of claim 3, further comprising:
   receiving, from a user, a source data block to be stored;

generating metadata for the source data block;
compressing the source data block using the compression algorithm with the first compression level to generate the first compressed data block;
compressing the metadata using the compression algorithm with the second compression level to generate a third compressed data block; and
storing the first compressed data block and the third compressed data block, respectively, to the first storage device and the second storage device.

6. An electronic device comprising:
a processor; and
a memory storing computer program instructions, the processor running the computer program instructions in a memory to control the electronic device to perform a method, the method comprising:
identifying a first hotness associated with a first compressed data block stored on a first storage device,
wherein the first hotness indicates access frequency of the first compressed data block for a predetermined period of time, and
wherein a first compression level of a compression algorithm for the first compressed data block corresponds to the first storage device;
making a first determination, based on the first hotness, that the first compressed data block is to be stored on a second storage device,
wherein a second type of the second storage device is different than a first type of the first storage device;
generating, based on the first determination, a second compressed data block from the first compressed data block to be stored on the second storage device;
making a second determination that a sum of a first time length and a second time length exceeds a time threshold,
wherein the first time length is how long the first compressed data block has been stored on the first storage device, and
wherein the second time length is how long the second compressed data block has been stored on the second storage device; and
migrating, based on the second determination, one selected from the group consisting of the first compressed data block and the second compressed data block to a cloud storage device.

7. The electronic device of claim 6, wherein the first determination comprises:
comparing the first hotness with a first threshold hotness; and
in response to the first hotness being larger than the first threshold hotness, determining that the first compressed data block is to be stored on the second storage device.

8. The electronic device of claim 6, wherein generating the second compressed data block comprises:
in response to determining that the first compressed data block is to be stored on the second storage device, decompressing the first compressed data block; and
compressing the decompressed first compressed data block using the compression algorithm with a second compression level to generate the second compressed data block,
wherein the second compression level corresponds to the second storage device and a compression degree for the second compression level is higher than a compression degree for the first compression level.

9. The electronic device of claim 6, wherein the method further comprises:
determining a second hotness related to the second compressed data block;
comparing the second hotness with a second threshold hotness; and
in response to the second hotness being less than the second threshold hotness:
storing the second compressed data block to the first storage device.

10. The electronic device of claim 8, wherein the method further comprises:
receiving, from a user, a source data block to be stored;
generating metadata for the source data block;
compressing the source data block using the compression algorithm with the first compression level to generate the first compressed data block;
compressing the metadata using the compression algorithm with the second compression level to generate a third compressed data block; and
storing the first compressed data block and the third compressed data block respectively to the first storage device and the second storage device.

11. A computer program product being tangibly stored on a non-volatile computer-readable medium and comprising machine-executable instructions which, when executed, cause a machine to perform a method, the method comprising:
identifying a first hotness associated with a first compressed data block stored on a first storage device,
wherein the first hotness indicates access frequency of the first compressed data block for a predetermined period of time, and
wherein a first compression level of a compression algorithm for the first compressed data block corresponds to the first storage device;
making a first determination, based on the first hotness, that the first compressed data block is to be stored on a second storage device,
wherein a second type of the second storage device is different than a first type of the first storage device;
generating, based on the first determination, a second compressed data block from the first compressed data block to be stored on the second storage device;
making a second determination that a sum of a first time length and a second time length exceeds a time threshold,
wherein the first time length is how long the first compressed data block has been stored on the first storage device, and
wherein the second time length is how long the second compressed data block has been stored on the second storage device; and
migrating, based on the second determination, one selected from the group consisting of the first compressed data block and the second compressed data block to a cloud storage device.

12. The computer program product of claim 11, wherein the first determination comprises:
comparing the first hotness with a first threshold hotness; and
in response to the first hotness being larger than the first threshold hotness, determining that the first compressed data block is to be stored on the second storage device.

13. The computer program product of claim 11, wherein generating the second compressed data block comprises:

in response to determining that the first compressed data block is to be stored on the second storage device, decompressing the first compressed data block; and compressing the decompressed first compressed data block using the compression algorithm with a second compression level to generate the second compressed data block, wherein the second compression level corresponds to the second storage device and a compression degree for the second compression level is higher than a compression degree for the first compression level.

14. The computer program product of claim 11, wherein the method further comprises:

determining a second hotness related to the second compressed data block;

comparing the second hotness with a second threshold hotness; and in response to the second hotness being less than the second threshold hotness:
storing the second compressed data block to the first storage device.

15. The computer program product of claim 13, wherein the method further comprises:

receiving, from a user, a source data block to be stored;

generating metadata for the source data block;

compressing the source data block using the compression algorithm with the first compression level to generate the first compressed data block;

compressing the metadata using the compression algorithm with the second compression level to generate a third compressed data block; and storing the first compressed data block and the third compressed data block, respectively, to the first storage device and the second storage device.

* * * * *